(12) United States Patent
Shimotsusa et al.

(10) Patent No.: US 10,158,817 B2
(45) Date of Patent: Dec. 18, 2018

(54) SOLID-STATE IMAGING APPARATUS AND IMAGING SYSTEM

(71) Applicant: CANON KABUSHIKI KAISHA, Tokyo (JP)

(72) Inventors: Mineo Shimotsusa, Machida (JP); Masatsugu Itahashi, Yokohama (JP); Masahiro Koboyashi, Tokyo (JP); Kazunari Kawabata, Kawasaki (JP); Takeshi Ichikawa, Hachioji (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/862,292

(22) Filed: Jan. 4, 2018

(65) Prior Publication Data

US 2018/0131885 A1 May 10, 2018

Related U.S. Application Data

(63) Continuation of application No. 15/094,032, filed on Apr. 8, 2016, now Pat. No. 9,906,743, which is a
(Continued)

(30) Foreign Application Priority Data

Mar. 14, 2014 (JP) .................................. 2014-051422

(51) Int. Cl.
*H04N 5/369* (2011.01)
*H04N 5/238* (2006.01)
(Continued)

(52) U.S. Cl.
CPC ....... *H04N 5/369* (2013.01); *H01L 27/14609* (2013.01); *H01L 27/14612* (2013.01);
(Continued)

(58) Field of Classification Search
CPC ......... H01L 27/14609; H01L 27/14612; H01L 27/14621; H01L 27/14623;
(Continued)

(56) References Cited

U.S. PATENT DOCUMENTS 6,271,880 B1  8/2001  Kameshima et al.
7,411,170 B2  8/2008  Shimotsusa
(Continued)

FOREIGN PATENT DOCUMENTS

JP     2000-150845    5/2000
JP     2009-176952    8/2009
(Continued)

OTHER PUBLICATIONS

Japanese Office Action dated Aug. 31, 2017 during prosecution of related Japanese application No. 2014-051422. (Previously cited during prosecution of parent U.S. Appl. No. 15/094,032.).
(Continued)

*Primary Examiner* — Amy Hsu
(74) *Attorney, Agent, or Firm* — Fitzpatrick, Cella, Harper & Scinto

(57) ABSTRACT

Provided is a solid-state imaging apparatus, including pixels each including: a photoelectric conversion unit; a charge accumulation unit; a transistor including a control electrode; a waveguide; and a light-shielding portion. The waveguide includes an incident portion and an output portion, the light-shielding portion includes a first portion that covers the control electrode of the transistor and a second portion that covers a part of the photoelectric conversion unit, the output portion and the photoelectric conversion unit are arranged with an interval therebetween, the interval between the output portion and the photoelectric conversion unit is larger than an interval between a lower end of the second portion of the light-shielding portion and the photoelectric conver-
(Continued)

sion unit, and the interval between the output portion and the photoelectric conversion unit is smaller than an interval between an upper end of the second portion of the light-shielding portion and the photoelectric conversion unit.

22 Claims, 8 Drawing Sheets

Related U.S. Application Data continuation of application No. 14/628,828, filed on Feb. 23, 2015, now Pat. No. 9,344,653.

(51) Int. Cl.
H04N 5/3745 (2011.01)
H01L 27/146 (2006.01)

(52) U.S. Cl.
CPC .. *H01L 27/14621* (2013.01); *H01L 27/14623* (2013.01); *H01L 27/14625* (2013.01); *H01L 27/14627* (2013.01); *H01L 27/14629* (2013.01); *H01L 27/14636* (2013.01); *H01L 27/14645* (2013.01); *H01L 27/14685* (2013.01); *H04N 5/238* (2013.01); *H04N 5/37452* (2013.01)

(58) Field of Classification Search
CPC ......... H01L 27/14625; H01L 27/14627; H01L 27/14629; H01L 27/14636; H01L 27/14645; H01L 27/14685; H04N 5/238; H04N 5/369; H04N 5/37452

See application file for complete search history.

(56) References Cited

U.S. PATENT DOCUMENTS

| | | | |
|---|---|---|---|
| 7,436,343 B2 | 10/2008 | Ichikawa | |
| 7,462,810 B2 | 12/2008 | Kobayashi | |
| 7,687,299 B2 | 3/2010 | Ichikawa | |
| 7,920,192 B2 | 4/2011 | Watanabe | |
| 7,928,477 B2 | 4/2011 | Kobayashi | |
| 7,935,557 B2 | 5/2011 | Mishima | |
| 7,935,995 B2 | 5/2011 | Watanabe | |
| 8,013,409 B2 * | 9/2011 | Itahashi | H01L 27/14629 257/432 |
| 8,045,034 B2 | 10/2011 | Shibata | |
| 8,259,206 B1 | 9/2012 | Shibata | |
| 8,274,122 B2 | 9/2012 | Shimotsusa | |
| 8,289,432 B2 | 10/2012 | Shibata | |
| 8,395,194 B2 | 3/2013 | Yokoyama | |
| 8,426,794 B2 | 4/2013 | Itahashi | |
| 8,456,559 B2 | 6/2013 | Yamashita | |
| 8,552,353 B2 | 10/2013 | Kobayashi | |
| 8,730,361 B2 | 5/2014 | Itahashi | |
| 8,779,544 B2 | 7/2014 | Yamashita | |
| 8,884,391 B2 | 11/2014 | Fudaba | |
| 8,970,769 B2 | 3/2015 | Shinohara | |
| 2010/0053398 A1 | 3/2010 | Yamashita | |
| 2010/0177226 A1* | 7/2010 | Itonaga | H01L 27/14603 348/300 |
| 2010/0202767 A1 | 8/2010 | Shirakawa | |
| 2010/0248263 A1 | 9/2010 | Hagerman | |
| 2011/0233702 A1* | 9/2011 | Takahashi | H01L 21/76898 257/432 |
| 2011/0241148 A1* | 10/2011 | Hiyama | H01L 27/14623 257/435 |
| 2012/0092536 A1 | 4/2012 | Hirota | |
| 2012/0199893 A1* | 8/2012 | Okabe | H01L 27/14641 257/291 |
| 2012/0199927 A1* | 8/2012 | Shimotsusa | H01L 27/14623 257/432 |
| 2013/0020667 A1* | 1/2013 | Nakazawa | H01L 27/14636 257/432 |
| 2013/0089963 A1 | 4/2013 | Mishima | |
| 2013/0182163 A1 | 7/2013 | Kobayashi | |
| 2013/0222657 A1 | 8/2013 | Shimotsusa | |
| 2014/0061436 A1 | 3/2014 | Kobayashi | |
| 2014/0063303 A1* | 3/2014 | Masuda | H01L 27/14625 348/294 |
| 2014/0160335 A1 | 6/2014 | Shimotsusa | |
| 2014/0217538 A1 | 8/2014 | Shimotsusa | |
| 2014/0300786 A1 | 10/2014 | Okita | |
| 2014/0340541 A1 | 11/2014 | Shimotsusa | |
| 2015/0222836 A1 | 8/2015 | Wada | |
| 2015/0264283 A1 | 9/2015 | Kobayashi | |
| 2015/0281614 A1 | 10/2015 | Yoshida | |
| 2016/0027825 A1 | 1/2016 | Moriyama | |
| 2016/0049439 A1* | 2/2016 | Yanagita | H01L 27/14623 257/432 |

FOREIGN PATENT DOCUMENTS

| | | |
|---|---|---|
| JP | 2010-232595 | 8/2009 |
| JP | 2009-283637 | 12/2009 |
| JP | 2011-238949 | 11/2011 |
| JP | 2011-299708 | 11/2011 |
| JP | 2012-4437 | 1/2012 |
| JP | 2013-168546 | 8/2013 |
| JP | 2013-207053 | 10/2013 |
| JP | 2014-36037 | 2/2014 |
| JP | 2015-176969 | 10/2015 |

OTHER PUBLICATIONS

Japanese Office Action dated Oct. 12, 2018 during prosecution of related Japanese application No. 2017-252782. English-language machine translation included.

* cited by examiner

SOLID-STATE IMAGING APPARATUS AND IMAGING SYSTEM

This application is a continuation of Application No. 15/094,032, filed Apr. 8, 2016, which is a continuation of Application No. 14/628,828, filed Feb. 23, 2015 (now U.S. Pat. No. 9,344,653, issued on May 17, 2016).

BACKGROUND OF THE INVENTION

Field of the Invention

The present invention relates to a solid-state imaging apparatus and an imaging system including the same.

Description of the Related Art

In Japanese Patent Application Laid-Open No. 2011-238949, there is a disclosure of a solid-state imaging apparatus having arranged pixels, in which the solid-state imaging apparatus includes a photoelectric conversion unit, an optical waveguide, and a charge accumulation unit to which charge is transferred from the photoelectric conversion unit. The optical waveguide is formed so as to converge light into the photoelectric conversion unit. Regions other than the photoelectric conversion unit are covered with a light-shielding film. Further, in Japanese Patent Application Laid-Open No. 2011-238949, there is a disclosure that the transfer of charge from the photoelectric conversion unit to the charge accumulation unit are started and ended simultaneously with respect to all the pixels, and thus an in-plane synchronous electronic shutter is realized.

When light enters the charge accumulation unit, charge is generated in the charge accumulation unit, which may cause noise. In Japanese Patent Application Laid-Open No. 2011-238949, there is no specific disclosure of the positional relationship between the optical waveguide and a light-shielding portion. Depending on the positional relationship between the optical waveguide and the light-shielding portion, the incident light may enter the charge accumulation unit to cause noise.

SUMMARY OF THE INVENTION

According to one embodiment of the present invention, there is provided a solid-state imaging apparatus, including a plurality of pixels each including: a photoelectric conversion unit configured to generate a signal charge by photoelectric conversion of incident light; a charge accumulation unit configured to accumulate the signal charge transferred from the photoelectric conversion unit; a transistor configured to transfer the signal charge from the photoelectric conversion unit to the charge accumulation unit, the transistor including a control electrode; a floating diffusion portion configured to receive the signal charge transferred from the charge accumulation unit; a waveguide configured to guide the incident light into the photoelectric conversion unit; and a light-shielding portion covering at least the charge accumulation unit and having an opening that allows the light output from the waveguide to pass therethrough. The waveguide includes an incident portion which the light enters and an output portion from which the light is output, the light-shielding portion includes a first portion that covers the control electrode of the transistor and a second portion that covers a part of the photoelectric conversion unit, the output portion and the photoelectric conversion unit are arranged with an interval therebetween, the interval between the output portion and the photoelectric conversion unit is larger than an interval between a lower end of the second portion of the light-shielding portion and the photoelectric conversion unit, and the interval between the output portion and the photoelectric conversion unit is smaller than an interval between an upper end of the second portion of the light-shielding portion and the photoelectric conversion unit.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings. Like components are denoted by like reference symbols throughout the drawings, and descriptions of overlapping components are sometimes omitted. Further, the embodiments below describe one aspect of the present invention in an exemplary manner, and hence the present invention is not limited to the embodiments below.

(First Embodiment)

Figure 1:
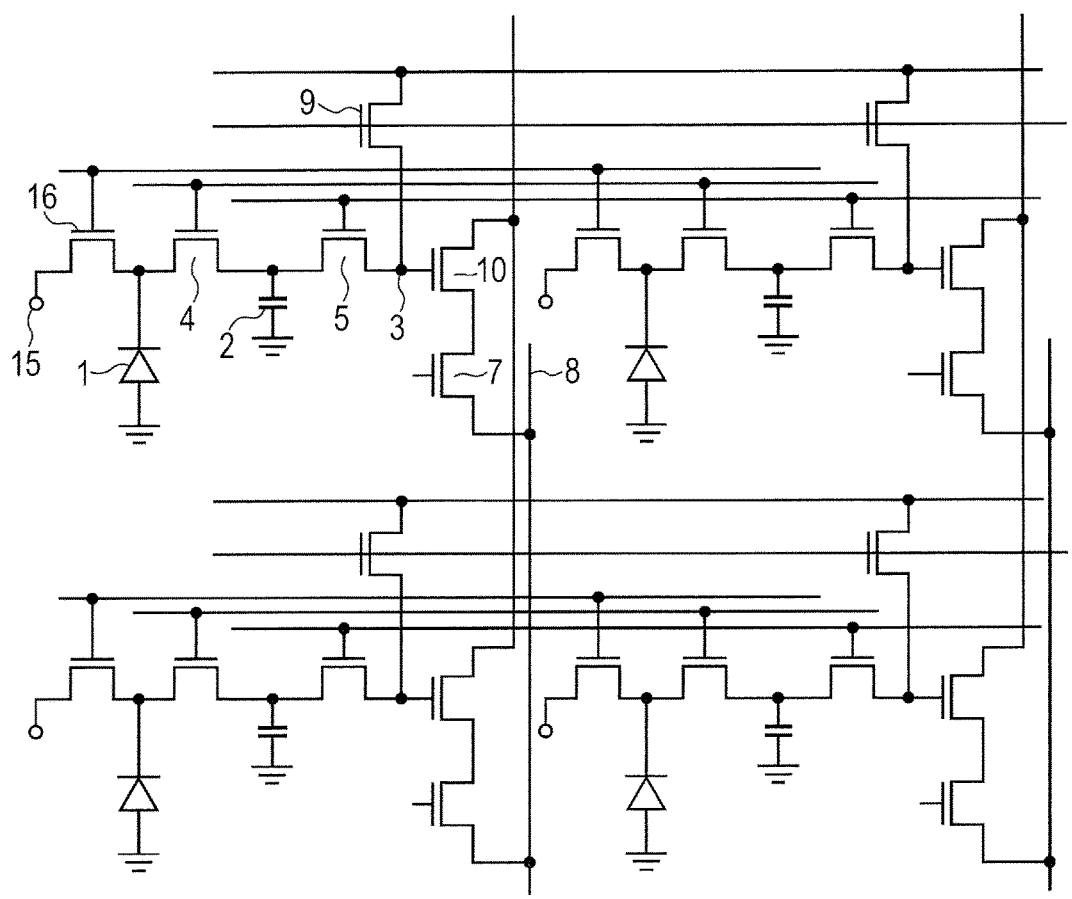
FIG. 1 is a diagram illustrating a circuit configuration of a pixel according to a first embodiment of the present invention.

FIG. 1 is a diagram illustrating a circuit configuration of a pixel according to a first embodiment of the present invention. Each of pixels serves as an element configured to convert incident light into an electric signal and output the electric signal. The pixels are arranged in matrix so as to form a pixel array serving as a light-receiving unit of a solid-state imaging apparatus. The pixel is formed on a semiconductor substrate made of silicon (Si) or the like.

The pixel includes a photoelectric conversion unit 1, a charge accumulation unit 2, a floating diffusion portion (FD portion) 3, a vertical output line 8, and an overflow drain portion (OFD portion) 15. The pixel further includes a first transfer transistor 4, a second transfer transistor 5, a select transistor 7, a reset transistor 9, a source follower transistor 10, and an OFD transistor 16, so as to switch connection and non-connection of each of the above-mentioned components or to amplify a signal. Each of the transistors is formed of a MOSFET or the like and includes a gate electrode formed as a control electrode between a drain and a source.

The photoelectric conversion unit 1 serves as an element configured to generate signal charge in accordance with the amount of the incident light. The charge accumulation unit 2 is connected to the photoelectric conversion unit 1 through the first transfer transistor 4. The charge accumulation unit 2 serves as a grounded capacitor in terms of a circuit and temporarily accumulates charge transferred from the photoelectric conversion unit 1.

The FD portion 3 converts the charge transferred from the charge accumulation unit 2 into a voltage signal. The FD portion 3 is connected to the charge accumulation unit 2 through the second transfer transistor 5. Further, the FD portion 3 is also connected to a source terminal of the reset transistor 9 and a gate terminal of the source follower transistor 10. A power source voltage is supplied to a drain terminal of the reset transistor 9. When the reset transistor 9 is turned on, the voltage at the FD portion 3 is reset to the power source voltage. In this case, a reset signal voltage is output to a source terminal of the source follower transistor 10.

When the transfer transistor 5 is turned on, and the charge is transferred from the charge accumulation unit 2 to the FD portion 3, a pixel signal voltage corresponding to the amount of the transferred charge is output to the source terminal of the source follower transistor 10.

The source terminal of the source follower transistor 10 is connected to a drain terminal of the select transistor 7. A source terminal of the select transistor 7 is connected to the vertical output line 8. When the select transistor 7 is turned on, a reset signal or a pixel signal is output to the vertical output line 8. Thus, a signal is read from the pixel.

The photoelectric conversion unit 1 is further connected to the OFD portion 15 through the OFD transistor 16. When the OFD transistor 16 is turned on, the charge accumulated in the photoelectric conversion unit 1 is discharged to the OFD portion 15. The charge is discharged to the OFD portion 15 simultaneously with respect to all the pixels, and thereafter the accumulated charge is transferred to the charge accumulation unit 2. Thus, an electronic shutter configured to set a predetermined exposure time simultaneously with respect to all the pixels is realized. With this, exposure timing lag, which is caused by reading charge from each pixel successively, is suppressed, with the result that an image distortion is reduced.

Figure 2A:
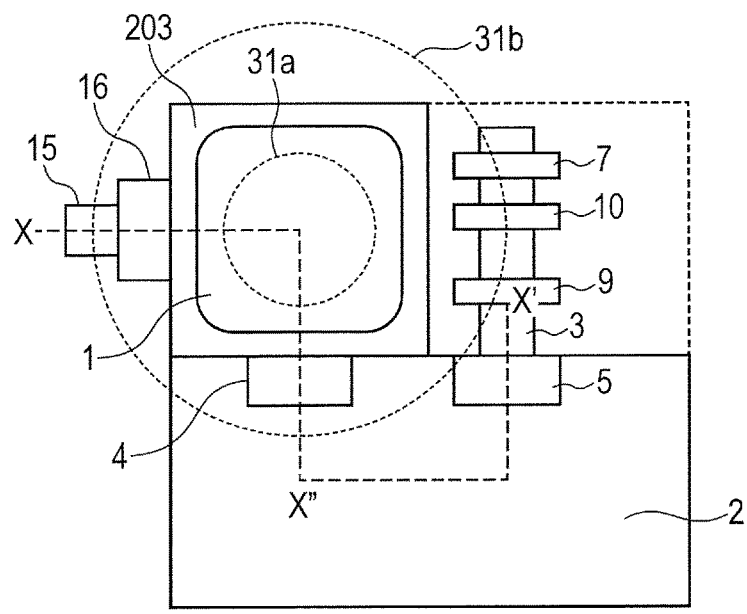
FIG. 2A is a plan view of the pixel according to the first embodiment.
Figure 2B:
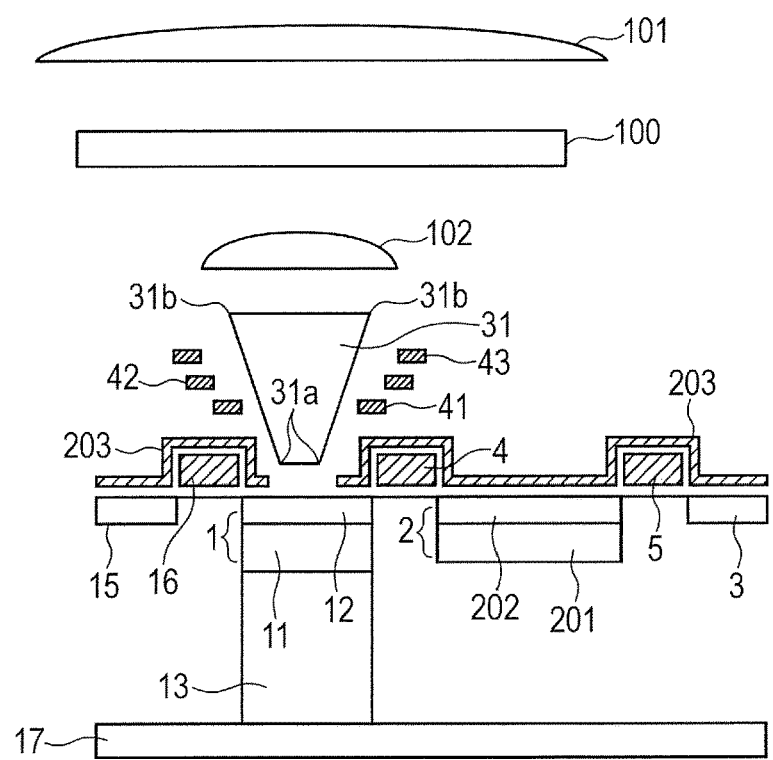
FIG. 2B is a sectional view of the pixel according to the first embodiment.

FIG. 2A is a plan view of the pixel according to the first embodiment of the present invention, and FIG. 2B is a sectional view taken along the line X-X' of FIG. 2A. Components corresponding to those of the circuit of FIG. 1 are denoted by the same reference symbols as those of FIG. 1, and the descriptions of the configurations and functions that are described above may be omitted.

The pixel further includes, as an optical system arranged immediately above the photoelectric conversion unit 1, a color filter 100, a microlens 101, an in-layer lens 102, and a waveguide 31. A buried photodiode is used as the photoelectric conversion unit 1. Light that enters from above the photoelectric conversion unit 1 passes through the microlens 101, the color filter 100, the in-layer lens 102, and the waveguide 31 in the stated order, and enters the photoelectric conversion unit 1 so as to be converted into an electron. Note that, although regions between the respective components including the in-layer lens 102, the waveguide 31, interconnects 41, 42, 43, the photoelectric conversion unit 1, and the like are illustrated as gaps in FIG. 2B, an interlayer insulating layer (not shown) is formed in each gap.

The microlens 101 and the in-layer lens 102 serve to increase the sensitivity by converging the incident light into the photoelectric conversion unit 1. The color filter 100 is formed of a thin film that selectively transmits light having a specific wavelength and is formed so as to obtain an image signal containing color information.

The waveguide 31 includes an upper opening (incident portion) facing the in-layer lens 102 side, which light enters, and a lower opening (output portion) facing the photoelectric conversion unit 1, from which the light is output. As illustrated in FIG. 2A, an end portion 31b of the upper opening and an end portion 31a of the lower opening have a circular shape. The waveguide 31 has a trapezoidal shape having a width of the upper opening wider than a width of the lower opening in the cross section taken along the line X-X' illustrated in FIG. 2B. Note that, although an upper surface of the waveguide 31 is illustrated as a circular shape, the upper surface may have a square shape, a rectangular shape, an oval shape, a polygonal shape, or the like.

The waveguide 31 serves to guide or converge the incident light into the photoelectric conversion unit 1. The amount of light entering the photoelectric conversion unit 1 increases due to the waveguide 31, and hence the sensitivity is increased compared to the case where the waveguide 31 is not formed. In particular, in the case where the area of the photoelectric conversion unit 1 is small or the F-number is large, there may arise a problem of a decrease in sensitivity. However, through formation of the waveguide 31, such a problem can be relieved.

As a material for the interlayer insulating layer between the interconnects, a silicon oxide film (SiO) having a refractive index of about 1.5 can be used. As a material for the waveguide 31, a silicon oxynitride film (SiON) having a refractive index of about 1.8 can be used. Light that enters an interface between the waveguide 31 and the interlayer insulating layer diagonally at a predetermined angle is totally reflected from the interface. Thus, the light propagates in the waveguide 31 without leaking to the interlayer insulating layer so as to be guided into the photoelectric conversion unit 1.

The materials for the interlayer insulating layer and the waveguide 31 are not limited to a combination of the silicon nitride film and the silicon oxynitride film. It is sufficient that the materials be combined so that the refractive index of the waveguide 31 becomes higher than that of the interlayer insulating layer, and any material may be selected. For example, the interlayer insulating layer may be formed of a silicon oxide film and the waveguide 31 may be formed of a silicon nitride film (SiN) having a refractive index of about 2.0. Further, an organic film material or a material obtained by mixing particles of titanium oxide or the like in the organic film material may be used. The interlayer insulating layer may be formed of a laminated film made of different materials. In this case, it is sufficient that the interlayer insulating layer be formed so that the refractive index of the waveguide 31 becomes higher than a volume average of the refractive index of the interlayer insulating layer on the periphery of the waveguide 31.

The tilt angle of a side wall of the waveguide 31 can be determined in accordance with the Snell's law. For example, in the case where the waveguide 31 has a refractive index of 1.9 and the interlayer insulating layer has a refractive index of 1.46, light that enters the waveguide 31 at an incident angle of 50.2° or more with respect to the normal to the side wall of the waveguide 31 is totally reflected. For example, when the angle of the side wall of the waveguide 31 is set to 39.8° or less with respect to the direction normal to the substrate, the leakage of the light that enters the waveguide 31 perpendicularly thereto is suppressed, and the light reaches the photoelectric conversion unit 1. As a ratio of the refractive index of the waveguide 31 with respect to the refractive index of the interlayer insulating layer is larger, a range of an incident angle at which the light can be totally reflected is widened, with the result that the degree of design freedom of the angle of the side wall of the waveguide 31 is increased.

A reflection preventing layer may be formed in an optical path of the incident light between the upper opening of the waveguide 31 and the in-layer lens 102 and between the lower opening and the photoelectric conversion unit 1, for example. With this, the loss of the amount of light caused by the reflection is reduced and the transmittance of the incident light is increased. Therefore, the sensitivity can be increased.

The pixel further includes the interconnects 41, 42, 43 configured to transmit a signal and the like. The interconnects 41, 42, 43 are formed of a material such as aluminum or copper that is less likely to transmit light, and hence the interconnects 41, 42, 43 are arranged on the periphery of the waveguide 31 while avoiding the waveguide 31.

Next, the structures of the photoelectric conversion unit 1 and the charge accumulation unit 2 are described. The photoelectric conversion unit 1 includes a first semiconductor region 11 of a first conductivity type and a second semiconductor region 12 of a second conductivity type. The second semiconductor region 12 is formed on a surface of the substrate, and the first semiconductor region 11 is arranged immediately below the second semiconductor region 12. The description is made hereinafter assuming that the first conductivity is an n-type and the second conductivity is a p-type. However, the first conductivity may be the p-type, and the second conductivity may be the n-type. A junction interface between the first semiconductor region 11 and the second semiconductor region 12 forms PN junction. Specifically, the photoelectric conversion unit 1 has a buried structure in which the PN-junction interface is located in the substrate so as not to be brought into contact with the surface of the substrate. In the buried structure, the PN-junction interface is buried in the substrate, and hence the influence of noise on the surface of the substrate is suppressed.

An n-type third semiconductor region 13 is further formed immediately below the first semiconductor region 11. The concentration of impurities of the third semiconductor region 13 is lower than that of the first semiconductor region 11. With this, electrons that have been subjected to photoelectric conversion in the third semiconductor region 13 can be collected in the first semiconductor region 11. Note that, the third semiconductor region 13 may be of the p-type.

A fourth semiconductor region 17 is formed in a lower portion of the third semiconductor region 13, and the fourth semiconductor region 17 extends to an area below the charge accumulation unit 2 and the FD portion 3. The fourth semiconductor region 17 is a p-type semiconductor region. The fourth semiconductor region 17 serves as a potential barrier with respect to the electrons generated in the photoelectric conversion unit 1 so as to suppress the leakage of the electrons to the substrate.

The charge accumulation unit 2 includes an n-type fifth semiconductor region 201 and a p-type sixth semiconductor region 202. The sixth semiconductor region 202 is formed on the surface of the substrate, and the fifth semiconductor region 201 is arranged immediately below the sixth semiconductor region 202. The charge accumulation section 2 also has a buried structure in the same way as in the photoelectric conversion unit 1 and can suppress noise on the surface of the substrate. Note that, it is also possible to adopt such a structure that the sixth semiconductor region 202 is omitted, and only the fifth semiconductor region 201 is arranged so as to form the charge accumulation unit 2. In this case, noise caused on the surface of the substrate can be suppressed by causing a gate electrode of the first transfer transistor 4 to extend so as to cover the charge accumulation unit 2 and applying a negative potential to the gate electrode so as to induce holes to the surface of the substrate.

The pixel further includes a light-shielding film 203 as a light-shielding portion configured to cover regions other than a region immediately above the photoelectric conversion unit 1. The light-shielding film 203 is arranged so as to cover at least the charge accumulation unit 2 and the gate electrode of the first transfer transistor 4. It is necessary that the regions other than the region immediately above the photoelectric conversion unit 1 be shielded from light, and the photoelectric conversion unit 1 be irradiated with light. Therefore, the region of the light-shielding film 203 immediately above the photoelectric conversion unit 1 serves as an opening that allows light output from the waveguide 31 to pass therethrough. Note that, the light-shielding film 203 may partially extend to above the end portion of the photoelectric conversion unit 1.

The light-shielding film 203 suppresses the entry of light into the charge accumulation unit 2 and the like. This suppresses the occurrence of noise caused by the generation of charge in the charge accumulation unit 2 due to the incident light. The light-shielding film 203 can be formed of a material, which is less likely to transmit visible light, such as tungsten, tungsten silicide, a tungsten oxide film, aluminum, or an alloy film thereof. The light-shielding film 203 has a thickness of, for example, about from 100 to 200 nm. The light-shielding film 203 is formed at a time in a region in which the gate electrode is arranged and in a region in which the gate electrode is not arranged. Therefore, the light-shielding film 203 has unevenness caused by the thickness of the gate electrode.

Figure 3:
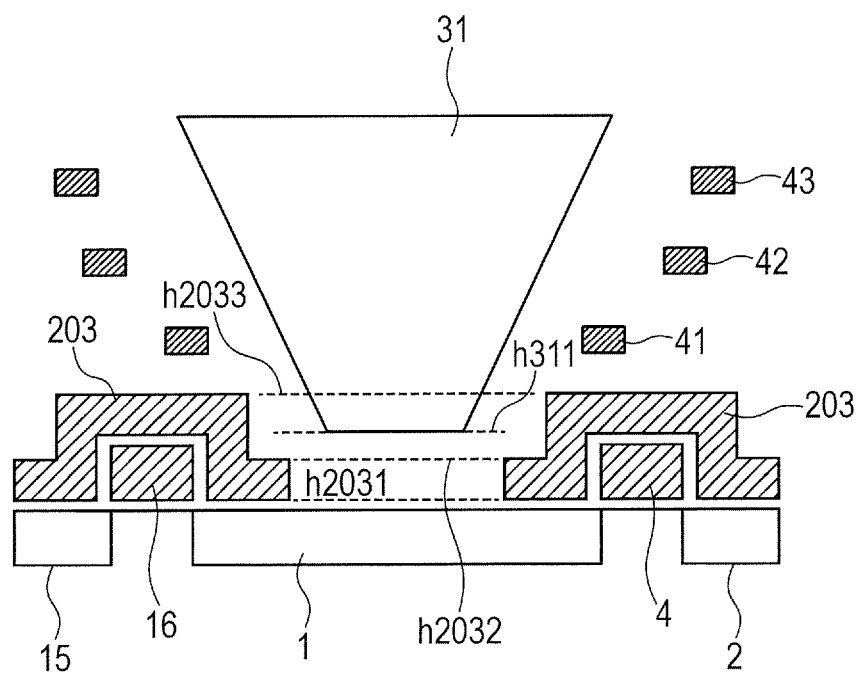
FIG. 3 is a view illustrating the positional relationship between a light-shielding film and a waveguide according to the first embodiment.

FIG. 3 is a view illustrating the positional relationship between the light-shielding film 203 and the waveguide 31 in this embodiment. FIG. 3 is a sectional view taken along the line X-X" of FIG. 2A and is an enlarged view of the vicinity of the photoelectric conversion unit 1 of FIG. 2B.

Dotted lines of FIG. 3, which are indicated by reference symbols h2031, h2032, h2033, and h311, represent intervals (heights) between the light-shielding film 203 and the waveguide 31, and the photoelectric conversion unit 1 that corresponds to the surface of the substrate. For example, the dotted line indicated by reference symbol h311 means that the position of a bottom portion (output portion) of the waveguide 31 has the height h311. In the description below, the expression "height of the bottom portion of the waveguide 31 is h311" and the like may be used with reference to the reference symbols.

It is assumed that the height of a lower end of the light-shielding film 203 is h2031, the height of an upper end of the light-shielding film 203 in a region in which the gate electrode is not formed is h2032, and the height of an upper end of the light-shielding film 203 in a region in which the light-shielding film 203 is formed on the gate electrode is h2033. It is preferred that the height h311 of the bottom portion of the waveguide 31 be set to be higher than the height h2031 of the lower end of the light-shielding film 203. In this embodiment, the height h311 of the bottom portion of the waveguide 31 is located between the height h2032 and the height 2033.

In the case where the height h311 of the bottom portion of the waveguide 31 is lower than the height h2031 of the lower end of the light-shielding film 203, light radiated from the bottom portion of the waveguide 31 is diffracted to spread and enters not only the photoelectric conversion unit 1 but also the charge accumulation unit 2. When the light enters the charge accumulation unit 2, charge is generated in a PN-junction portion of the charge accumulation unit 2 and may cause noise. In contrast, in this embodiment, the height h311 of the bottom portion of the waveguide 31 is higher than the height h2031 of the lower end of the light-shielding film 203. Thus, even when the light radiated from the bottom portion of the waveguide is diffracted to spread, the light is blocked by the light-shielding film 203. Thus, the entry of the light into the charge accumulation unit 2 can be alleviated or prevented, and hence the occurrence of noise can be suppressed.

Figure 4A:
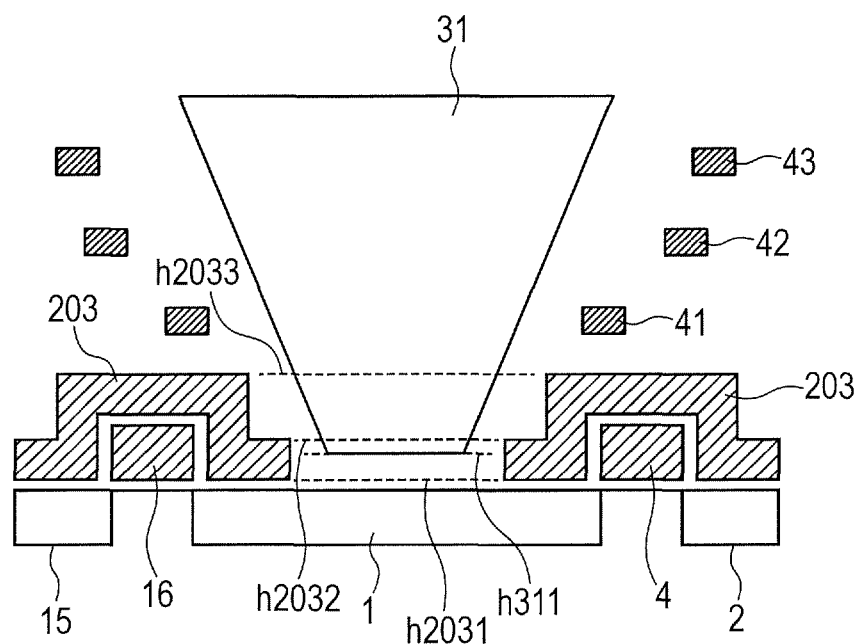
FIG. 4A is a view illustrating a modified example of the positional relationship between the light-shielding film and the waveguide according to the first embodiment.
Figure 4B:
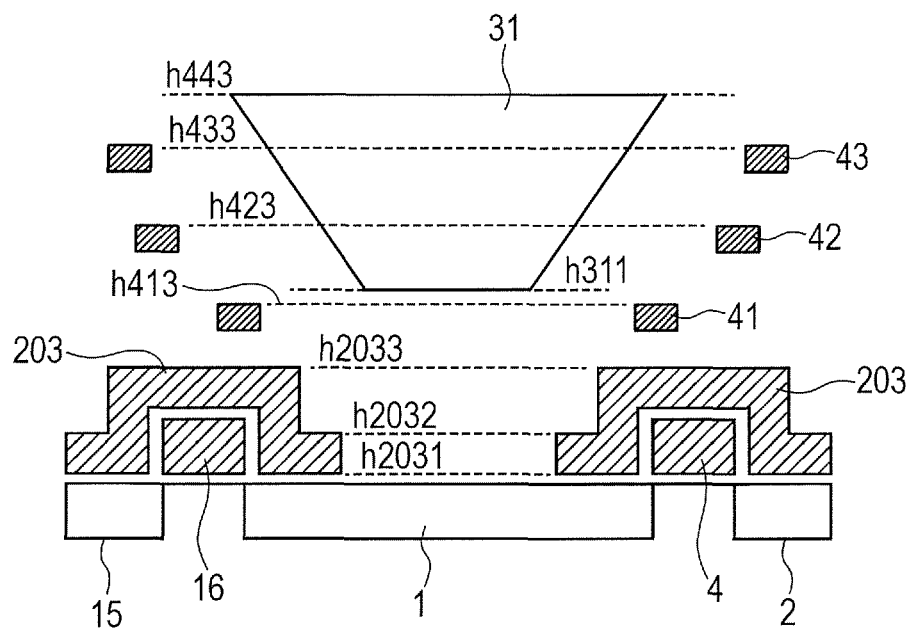
FIG. 4B is a view illustrating another modified example of the positional relationship between the light-shielding film and the waveguide according to the first embodiment.

FIGS. 4A and 4B are views illustrating modified examples of the positional relationship between the waveguide 31 and the light-shielding film 203. FIGS. 4A and 4B are also sectional views taken along the line X-X" of FIG. 2A, illustrating the vicinity of the photoelectric conversion unit 1 of FIG. 2B in an enlarged state. In FIGS. 4A and 4B, the position of the waveguide 31 varies with respect to the configuration illustrated in FIG. 3.

In FIG. 4A, the height h311 of the bottom portion of the waveguide 31 is located between the height h2031 of the lower end of the light-shielding film 203 and the height h2032 of the upper end of the light-shielding film 203 in the region in which the gate electrode is not formed (in a region in which the light-shielding film 203 extends to above a part of the photoelectric conversion unit 1). In this case, the light that is radiated from the bottom portion of the waveguide 31 and then diffracted is reflected from a side surface of the light-shielding film 203. Thus, the entry of the light into the charge accumulation unit 2 can be alleviated or prevented in the same way as in the above-mentioned case, and hence the occurrence of noise can be suppressed. The light reflected from the side surface of the light-shielding film 203 can enter the photoelectric conversion unit 1. A light component reflected from an upper surface of the light-shielding film 203 is reduced, and the amount of light reflected from the side surface of the light-shielding film 203 so as to be guided into the photoelectric conversion unit 1 increases. Thus, higher sensitivity can be obtained.

In FIG. 4B, the height h311 of the bottom portion of the waveguide 31 is higher than the height h2033 of the upper end of the light-shielding film 203 in the region in which the light-shielding film 203 is formed on the gate electrode. The waveguide 31 is formed so as to transmit the light entering the pixel through a layer in which the interconnects 41, 42, 43 and the interlayer insulating layers therebetween are formed, and to converge the light into the photoelectric conversion unit 1. Therefore, it is sufficient that the waveguide 31 be formed so as to pass through at least one layer in which the interconnects 41, 42, 43 of the circuit and the interlayer insulating layers are formed. It is assumed that the heights of the interconnects 41, 42, 43 of the circuit and an upper end surface of the interlayer insulating layer formed on the interconnect 43 are h413, h423, h433, and h443, respectively. In this case, the above-mentioned effect can be obtained as long as the height h311 of the bottom portion of the waveguide 31 is lower than at least the height h433. It is more preferred that the height h311 of the bottom portion of the waveguide 31 be lower than the height h423 of an upper end surface of the interconnect 42. FIG. 4B illustrates, as a more preferred example, the case where the height h311 of the bottom portion of the waveguide 31 is located between the height h423 of the upper end surface of the interconnect 42 and the height h413 of an upper end surface of the interconnect 41.

(Second Embodiment)

Figure 5:
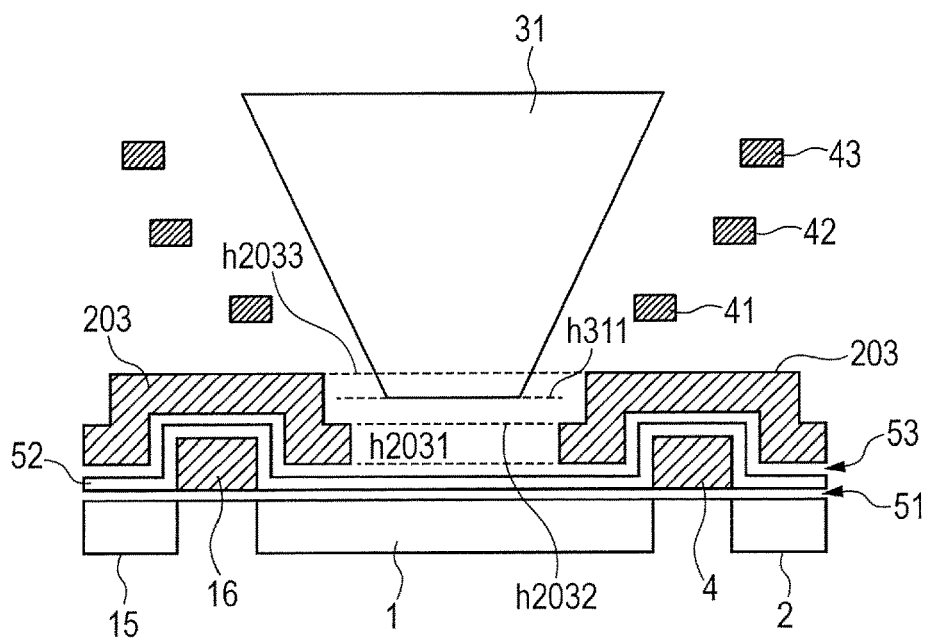
FIG. 5 is a view illustrating the positional relationship between a light-shielding film and a waveguide according to a second embodiment of the present invention.

FIG. 5 is a view illustrating the positional relationship between the light-shielding film 203 and the waveguide 31 according to a second embodiment of the present invention. FIG. 5 is a sectional view of a portion taken along the line X-X" of FIG. 2A, illustrating the vicinity of the photoelectric conversion unit 1 in an enlarged state. In this embodiment, a reflection preventing layer 52 is arranged between the waveguide 31 and the photoelectric conversion unit 1 in addition to the configuration of the first embodiment.

A gate insulating film 51 is formed between the gate electrodes of the first transfer transistor 4 and the OFD transistor 16, and the substrate. The gate insulating film 51 is formed of, for example, a silicon oxide film and has a thickness of about 10 nm. The reflection preventing layer 52 is formed on the gate insulating film 51.

The reflection preventing layer 52 is formed of, for example, a silicon nitride film and has a thickness of about 50 nm. A buffer film 53 is formed between the reflection preventing layer 52 and the light-shielding film 203. The buffer film 53 is formed of, for example, a silicon oxide film and has a thickness of about from 20 to 100 nm. In order to obtain the effect of preventing reflection, it is necessary to set a suitable distance between the waveguide 31 and the reflection preventing layer 52. Assuming that the wavelength of light is 550 nm, and the refractive index of the waveguide 31 is 1.8, it is appropriate that the distance between the waveguide 31 and the reflection preventing layer 52 be about 110 nm. Therefore, the distance from the substrate to the height h311 of the bottom portion of the waveguide 31 is about 170 nm, and the distance from the substrate to the height h2031 of the lower end of the light-shielding film 203 is about from 80 to 160 nm. Based on the relationship of those distances, the distance between the height h311 of the bottom portion of the waveguide 31 and the height h2031 of the lower end of the light-shielding film 203 is from 10 to 90 nm. That is, it is possible to set the height h311 of the bottom portion of the waveguide 31 to be higher than the height h2031 of the lower end of the light-shielding film 203.

Thus, also in this embodiment, the entry of the light into the charge accumulation section 2 can be alleviated or prevented in the same way as in the first embodiment, and hence the occurrence of noise can be suppressed. In addition, due to the effect of the reflection preventing layer 52, the loss of the amount of light caused by the reflection is reduced and the transmittance of the incident light is increased. Therefore, the sensitivity can be increased.

(Third Embodiment)

Figure 6:
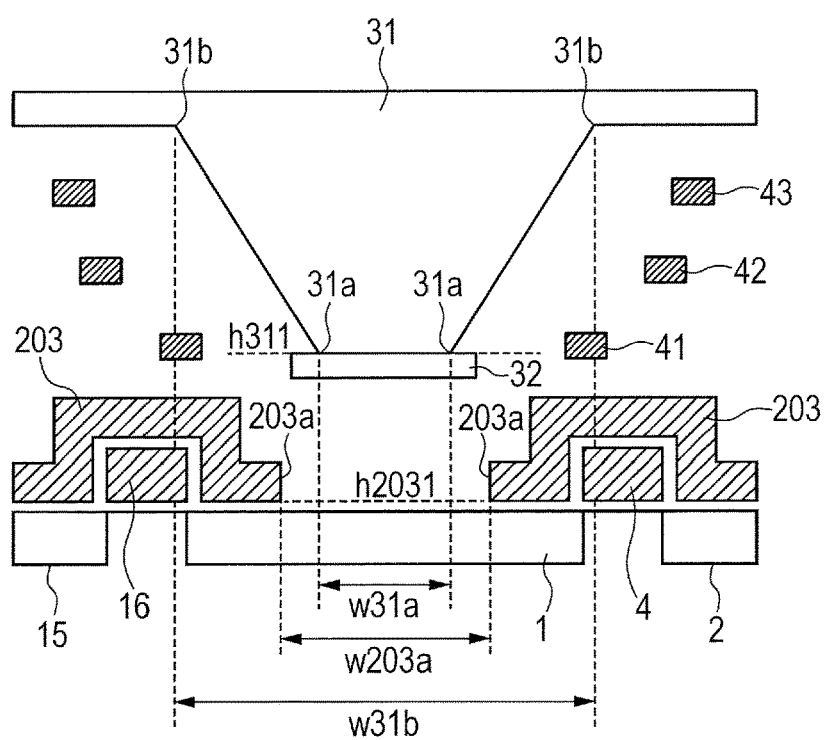
FIG. 6 is a view illustrating the positional relationship between a light-shielding film and a waveguide according to a third embodiment of the present invention.

FIG. 6 is a view illustrating the positional relationship between the light-shielding film 203 and the waveguide 31 according to a third embodiment of the present invention. FIG. 6 is a sectional view of a portion taken along the line X-X" of FIG. 2A, illustrating the vicinity of the photoelectric conversion unit 1 in an enlarged state.

The waveguide 31 of FIG. 6 forms a T-shape in which an upper opening has a region extending outwardly, in addition to the above-mentioned trapezoidal shape. Further, an etching stop layer (ESL) 32 to be used for forming the waveguide 31 is formed in the bottom portion of the waveguide 31 of FIG. 6. The ESL 32 is a layer formed so as to complete an etching step stably at a predetermined depth. The ESL 32 has a thickness of, for example, 50 nm. In the case where the ESL 32 has the same refractive index as that of the waveguide 31, the ESL 32 has the effect of converging or guiding the incident light in the same way as in the waveguide 31. The shape of this embodiment may be adopted for manufacturing reasons.

It is assumed that the width of an opening in the bottom portion of the waveguide 31 (waveguide lower opening width) is w31a, the width of an opening in a top portion of the waveguide 31 (waveguide upper opening width) is w31b, and the width of an opening of the light-shielding film 203 (light-shielding opening width) is w203a. In the same way as in the first embodiment, the height h311 of the bottom portion of the waveguide 31 is higher than the height h2031 of the lower end of the light-shielding film 203. The effect obtained from this configuration is the same as described above in the first embodiment. In addition, in this embodiment, the light-shielding opening width w203a of the light-shielding film 203 is larger than the waveguide lower opening width w31a and smaller than the waveguide upper opening width w31b. In this case, an end portion 203a of the light-shielding film 203 is located between the end portion 31a of the bottom portion of the waveguide 31 and an end portion 31b of the top portion of the waveguide 31, when viewed from an optical axis direction of the waveguide 31. The effect obtained from this configuration is hereinafter described.

In the case where the light-shielding opening width w203a is smaller than the waveguide lower opening width w31a, a part of the light output from the bottom portion of the waveguide 31 is reflected from the light-shielding film 203, and the light flowing into the photoelectric conversion unit 1 is reduced, with the result that the sensitivity may be decreased. In contrast, in this embodiment, the light-shielding opening width w203a is set to be larger than the waveguide lower opening width w31a. Therefore, the light output from the bottom portion of the waveguide 31 is less liable to be reflected from the light-shielding film 203, and hence the sensitivity is increased.

On the other hand, in the case where the light-shielding opening width w203a is larger than the waveguide upper opening width w31b, the incident light cannot be taken in the waveguide 31 sufficiently, with the result that the sensitivity may be decreased. Further, when the light-shielding opening width w203a is larger than the waveguide upper opening width w31b, the diffracted light may enter the charge accumulation unit 2 to cause noise. In contrast, in this embodiment, the light-shielding opening width w203a is set to be smaller than the waveguide upper opening width w31b. Therefore, the sensitivity is increased, and the entry of the light into the charge accumulation unit 2 is prevented, with the result that the occurrence of noise is suppressed.

Note that, it is sufficient that the interconnects 41, 42, 43 be positioned on an outer side with respect to the end portion 31a of the bottom portion of the waveguide 31, and the interconnects 41, 42, 43 may be positioned on an inner side with respect to the end portion 31b of the top portion of the waveguide 31. The same also applies to the other embodiments.

(Fourth Embodiment)

Figure 7A:
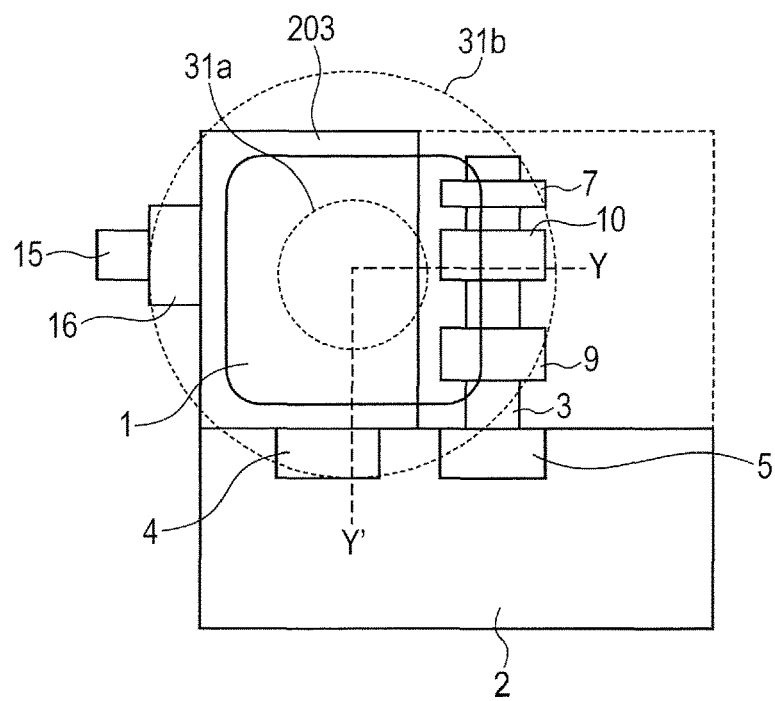
FIG. 7A is a plan view of a pixel according to a fourth embodiment of the present invention.
Figure 7B:
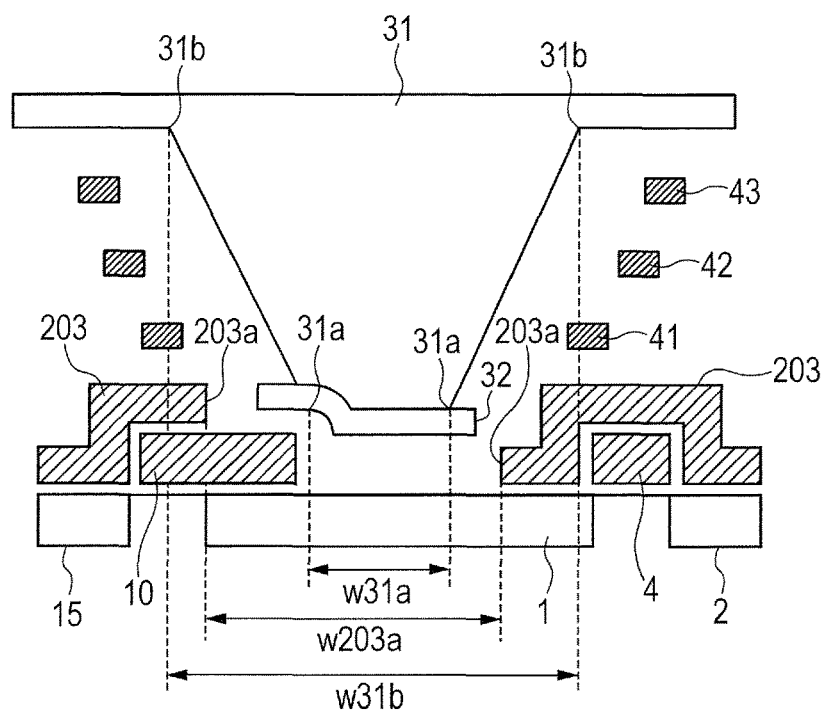
FIG. 7B is a sectional view of the pixel according to the fourth embodiment.

FIG. 7A is a plan view of a pixel according to a fourth embodiment of the present invention. FIG. 7B is a sectional view taken along the line Y-Y' of FIG. 7A. The corresponding components are denoted by the same reference symbols.

This embodiment is different from each of the above-mentioned embodiments in that, as illustrated in FIGS. 7A and 7B, the opening of the light-shielding film 203 partially overlaps with the source follower transistor 10, the select transistor 7, and the reset transistor 9. Therefore, a difference in level is formed during formation of the ESL 32 due to the difference in level of the gate electrodes of the source follower transistor 10 and the like, with the result that the bottom portion of the waveguide 31 has a shape having a difference in level.

For the above-mentioned reason, the light-shielding of the charge accumulation unit 2 is required in order to prevent noise. In contrast, the light-shielding of the source follower transistor 10, the select transistor 7, and the reset transistor 9 is not necessarily required.

Also in this embodiment, it is sufficient that the end portion 203a of the light-shielding film 203 is located between the end portion 31a of the bottom portion of the waveguide 31 and the end portion 31b of the top portion of the waveguide 31 in a direction from the photoelectric conversion unit 1 to the charge accumulation unit 2, in the same way as in the third embodiment. Specifically, it is sufficient that the gate electrodes of the source follower transistor 10 and the like overlap with the opening of the light-shielding film 203. With this arrangement, the usage efficiency of the element area can be enhanced while the light-shielding of the charge accumulation unit 2 is maintained. Thus, both the reduction in size of the pixel and the suppression of noise can be satisfied by using the shape and element layout of the waveguide 31 of the fourth embodiment.

(Fifth Embodiment)

Figure 8:
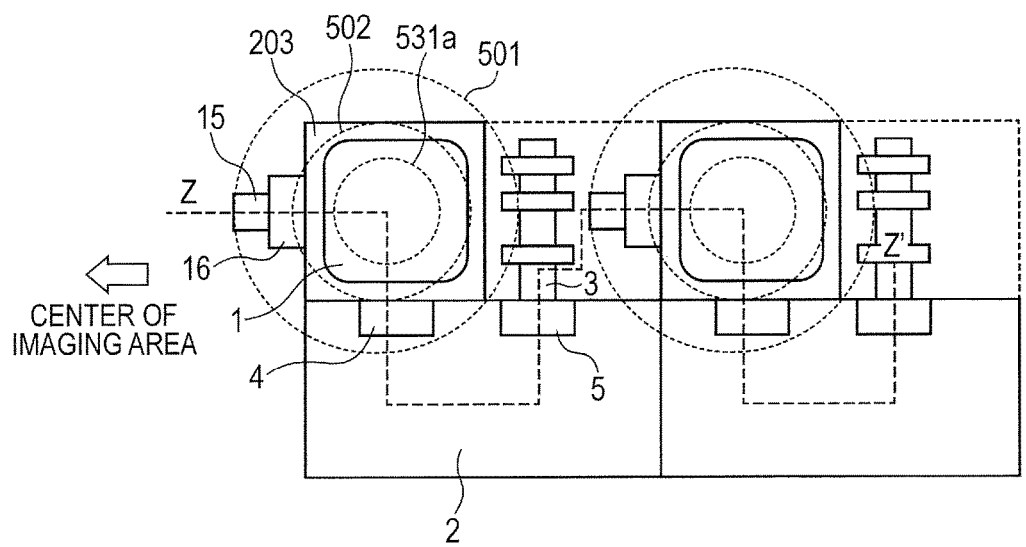
FIG. 8 is a plan view of a pixel according to a fifth embodiment of the present invention.
Figure 9:
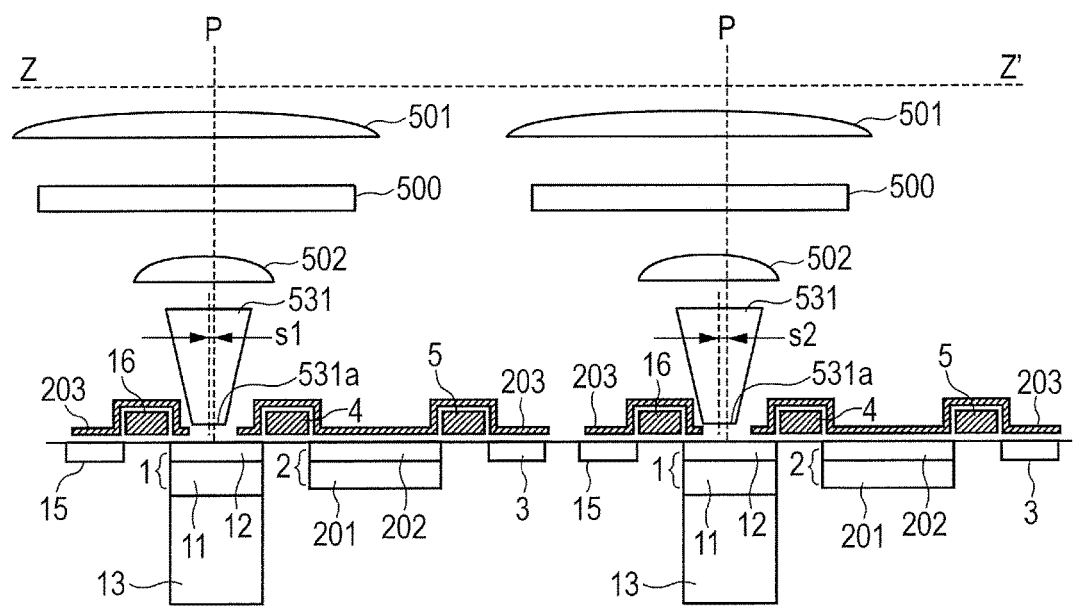
FIG. 9 is a sectional view of the pixel according to the fifth embodiment.

A fifth embodiment of the present invention is described with reference to FIGS. 8 and 9. In FIGS. 8 and 9, the components having the same functions as those of FIGS. 2A and 2B are denoted by the same reference symbols as those of FIGS. 2A and 2B. FIG. 8 is a plan view of a pixel according to the fifth embodiment, and FIG. 9 is a sectional view of the pixel according to the fifth embodiment taken along the line Z-Z' of FIG. 8. The pixel according to the fifth embodiment is used as a pixel to be arranged on the periphery of a pixel array of a solid-state imaging apparatus. There may be a case where light radiated from a subject diagonally enters the pixel on the periphery of the pixel array. The light that diagonally enters the pixel is partially blocked by the light-shielding film 203, and the amount of light entering the photoelectric conversion unit 1 may be reduced. As a result, the amount of light becomes insufficient on the periphery of the pixel array. When an image is photographed with a photographing system such as a camera using such a pixel array, the periphery of the image may become darker due to the shortage of the amount of light.

In order to enhance the waveguide performance or the converging performance of the incident light also with respect to the diagonal incident light, in this embodiment, a microlens 501, a color filter 500, an in-layer lens 502, and a waveguide 531 are arranged so as to be shifted in a direction of a center of an imaging area of a sensor chip from a normal P passing through the center of the pixel. The waveguide 531 has an opening 531a in a bottom portion as illustrated in FIGS. 8 and 9. With this, compared to the case where the centers of the microlens 101, the in-layer lens 102, the waveguide 31, and the like are matched with the normal P as illustrated in FIG. 2B, the loss of light caused when the diagonal incident light is blocked by the light-shielding film 203 is suppressed. Thus, the shortage of the amount of light on the periphery of the pixel array can be relieved by using the pixel according to this embodiment on the periphery of the pixel array. Note that, the "center of the pixel" corresponding to the position of the normal P may be defined by the center of gravity of the opening of the light-shielding film 203 or by the center of gravity of the semiconductor regions of the first and second conductivities, which form the photoelectric conversion unit 1.

Note that, the shift amount of the optical members such as the microlens 501, the in-layer lens 502, and the waveguide 531 may be appropriately adjusted based on the sensitivity, the optical characteristics, and the light-shielding performance of the charge accumulation unit 2. For example, each apex of the microlens 501, the in-layer lens 502, and the waveguide 531 may be set uniformly with respect to a row or a column of each pixel. The shift amount may be increased in accordance with the distance from the center of the pixel array. In two pixels illustrated in FIG. 9, the pixel on the left side is closer to the center of the imaging area, compared to the pixel on the right side. In this case, as illustrated in FIG. 9, it is preferred that a shift amount S2 of the waveguide 531 of the pixel on the right side far from the center of the imaging area (pixel array) be set to be larger than a shift amount S1 of the waveguide 531 of the pixel on the left side close to the center of the imaging area.

Optical members to be shifted from the center of the pixel array can be selected appropriately. Only one of the microlens 501, the in-layer lens 502, the waveguide 531, and the color filter 500 may be shifted or two or more of those may be shifted. The shift amount may be varied in the respective optical members, and it is preferred that the shift amount of the optical member positioned farther from the photoelectric conversion unit 1 be set to be larger.

Further, as a modified example of this embodiment, the optical members may be shifted in a direction in which the photoelectric conversion unit 1 and the charge accumulation unit 2 are arrayed (vertical direction of FIG. 8). The entry of the light into the charge accumulation unit 2 can be further alleviated or prevented, and hence the occurrence of noise can be further suppressed.

(Sixth Embodiment)

Figure 10:
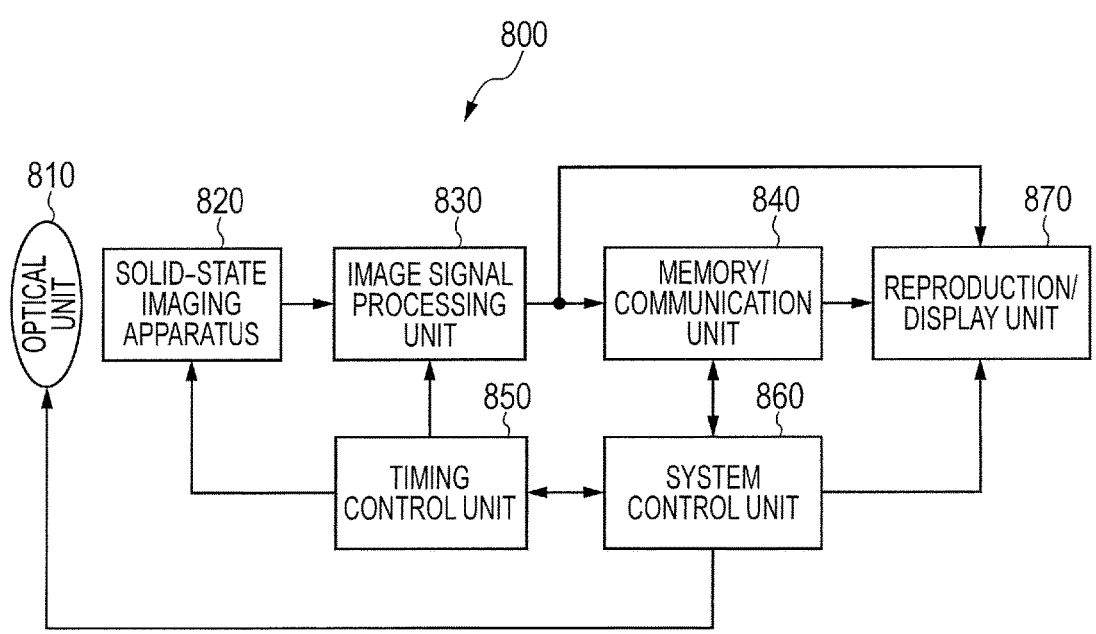
FIG. 10 is a block diagram of an imaging system according to a sixth embodiment of the present invention.

FIG. 10 is a diagram illustrating a configuration of an imaging system including a solid-state imaging apparatus according to a sixth embodiment of the present invention. An imaging system 800 includes an optical unit 810, a solid-state imaging apparatus 820, an image signal processing unit 830, a memory/communication unit 840, a timing control unit 850, a system control unit 860, and a reproduction/display unit 870. As the solid-state imaging apparatus 820, the solid-state imaging apparatus described above as the first to fifth embodiments is used.

The optical unit 810, which is an optical system such as a lens, forms an image of light from a subject on the pixel array of the solid-state imaging apparatus 820 in which a plurality of pixels are two-dimensionally arranged, to thereby form an image of the subject. The solid-state imaging apparatus 820 outputs a signal corresponding to the light whose image is formed on the pixel at the timing based on a signal transmitted from the timing control unit 850. The signal output from the solid-state imaging apparatus 820 is input to the image signal processing unit 830. The image signal processing unit 830 processes the input signal in accordance with a method determined by a program or the like. The signal obtained through the processing in the image signal processing unit 830 is transmitted to the memory/communication unit 840 as image data. The memory/communication unit 840 transmits a signal for forming an image to the reproduction/display unit 870, to thereby cause the reproduction/display unit 870 to reproduce or display a moving image or a still image. Further, in response to the signal from the image signal processing unit 830, the memory/communication unit 840 communicates to/from the system control unit 860 and records the signal for forming an image in a recording medium (not shown).

The system control unit 860 controls the operation of the imaging system 800 in a comprehensive manner, and controls the drive of the optical unit 810, the timing control unit 850, the memory/communication unit 840, and the reproduction/display unit 870. The system control unit 860 includes a memory device (not shown), such as a recording medium. A program and the like necessary for controlling the operation of the imaging system 800 are recorded in the memory device. The system control unit 860 supplies the imaging system 800 with a signal for switching a drive mode in accordance with a user's operation, for example. Specifically, the system control unit 860 supplies the imaging system 800 with a signal for performing switching, such as the change of a row to be read or a row to be reset, the change of the angle of view accompanying electronic zooming, and the shift of the angle of view accompanying electronic image stabilization. The timing control unit 850 controls drive timings of the solid-state imaging apparatus 820 and the image signal processing unit 830 based on the control by the system control unit 860.

Through mounting of the solid-state imaging apparatus 820 according to this embodiment, the imaging system 800 capable of suppressing the occurrence of noise can be implemented.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-051422, filed Mar. 14, 2014, which is hereby incorporated by reference herein in its entirety.

What is claimed is:

1. A solid-state imaging apparatus, comprising:
   a semiconductor substrate;
   a plurality of pixels arranged in the semiconductor substrate, each pixel including a photoelectric conversion unit configured to generate a signal charge by photoelectric conversion of incident light, a charge accumulation unit configured to accumulate the signal charge transferred from the photoelectric conversion unit, a transistor configured to transfer the signal charge from the photoelectric conversion unit to the charge accumulation unit, the transistor including a control electrode, and a floating diffusion portion configured to receive the signal charge transferred from the charge accumulation unit;
   a waveguide configured to guide the incident light into the photoelectric conversion unit;
   a light-shielding portion covering at least the control electrode and the charge accumulation unit; and
   a plurality of wiring layers arranged above the light-shielding portion,
   wherein:
   the waveguide has an upper end located at a position farther from the semiconductor substrate than at least a part of the plurality of wiring layers and a lower end located at a position closer to the semiconductor substrate than the at least part of the plurality of wiring layers, an insulating layer is arranged between the lower end of the waveguide and the semiconductor substrate, and a distance between the lower end of the waveguide and the semiconductor substrate is smaller than a distance between an upper end of the light-shielding portion and the semiconductor substrate.

2. The solid-state imaging apparatus according to claim 1, wherein at least a part of an edge of an opening of the light-shielding portion is positioned between the upper end and the lower end as seen from an optical axis direction of the waveguide.

3. The solid-state imaging apparatus according to claim 1, wherein a width of an opening of the light-shielding portion is larger than a width of the lower end and smaller than a width of the upper end.

4. The solid-state imaging apparatus according to claim 1, wherein the lower end of the waveguide includes an interface between the waveguide and an etching stop layer.

5. The solid-state imaging apparatus according to claim 1, wherein the lower end of the waveguide includes an interface between the waveguide and an interlayer insulating layer.

6. The solid-state imaging apparatus according to claim 1, wherein the lower end of the waveguide has a shape having a difference in level.

7. The solid-state imaging apparatus according to claim 1, wherein the light-shielding portion includes a first portion which is arranged at a same height from the semiconductor substrate as the control electrode and a second portion which is arranged above the control electrode.

8. The solid-state imaging apparatus according to claim 7, wherein the first portion and the control electrode are provided with a distance therebetween, and
the second portion and the control electrode are provided with a distance therebetween.

9. The solid-state imaging apparatus according to claim 8, wherein the light-shielding portion includes a third portion which is arranged at a same height as the control electrode, and
the control electrode is arranged between the first portion and the third portion in a cross section including the control electrode and the light-shielding portion.

10. The solid-state imaging apparatus according to claim 9, wherein the charge accumulation unit includes a first semiconductor region of a first conductivity type holding the signal charge and a second semiconductor region of a second conductivity type arranged between the first semiconductor region and the light-shielding portion.

11. The solid-state imaging apparatus according to claim 9, further comprising a color filter and a microlens which are arranged above the waveguide.

12. An imaging system, comprising:
the solid-state imaging apparatus according to claim 1; and
an image signal processing unit configured to process a signal output from the solid-state imaging apparatus.

13. A solid-state imaging apparatus, comprising:
a semiconductor substrate;
a plurality of pixels arranged in the semiconductor substrate, each pixel including a photoelectric conversion unit configured to generate a signal charge by photoelectric conversion of incident light, a charge accumulation unit configured to accumulate the signal charge transferred from the photoelectric conversion unit, a transistor configured to transfer the signal charge from the photoelectric conversion unit to the charge accumulation unit, the transistor including a control electrode, and a floating diffusion portion configured to receive the signal charge transferred from the charge accumulation unit;
a waveguide configured to guide the incident light into the photoelectric conversion unit;
a light-shielding portion covering at least the control electrode and the charge accumulation unit; and
a plurality of wiring layers arranged above the light-shielding portion,
wherein:
an insulating layer is arranged between the waveguide and the semiconductor substrate, and
the waveguide includes a first portion which is arranged at a same height from the semiconductor substrate as at least one of the plurality of wiring layers and a second portion which is arranged at a same height from the semiconductor substrate as at least a part of the light-shielding portion.

14. The solid-state imaging apparatus according to claim 13, wherein a width of an opening of the light-shielding portion is larger than a width of the lower end and smaller than a width of the upper end.

15. The solid-state imaging apparatus according to claim 13, wherein the lower end of the waveguide includes an interface between the waveguide and an etching stop layer.

16. The solid-state imaging apparatus according to claim 13, wherein the lower end of the waveguide includes an interface between the waveguide and an interlayer insulating layer.

17. The solid-state imaging apparatus according to claim 13, wherein the light-shielding portion includes a first portion which is arranged at a same height from the semiconductor substrate as the control electrode and a second portion which is arranged above the control electrode.

18. The solid-state imaging apparatus according to claim 17,
wherein the first portion and the control electrode are provided with a distance therebetween, and
the second portion and the control electrode are provided with a distance therebetween.

19. The solid-state imaging apparatus according to claim 18,
wherein the light-shielding portion includes a third portion which is arranged at a same height as the control electrode, and
the control electrode is arranged between the first portion and the third portion in a cross section including the control electrode and the light-shielding portion.

20. The solid-state imaging apparatus according to claim 19, wherein the charge accumulation unit includes a first semiconductor region of a first conductivity type holding the signal charge and a second semiconductor region of a second conductivity type arranged between the first semiconductor region and the light-shielding portion.

21. The solid-state imaging apparatus according to claim 19, further comprising a color filter and a microlens which are arranged above the waveguide.

22. An imaging system, comprising:
the solid-state imaging apparatus according to claim 13; and
an image signal processing unit configured to process a signal output from the solid-state imaging apparatus.

* * * * *